(12) United States Patent
Ogura et al.

(10) Patent No.: US 10,304,969 B2
(45) Date of Patent: May 28, 2019

(54) SEMICONDUCTOR DEVICE

(71) Applicant: Kabushiki Kaisha Toshiba, Minato-ku, Tokyo (JP)

(72) Inventors: Tsuneo Ogura, Kamakura Kanagawa (JP); Tomoko Matsudai, Shibuya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/046,975

(22) Filed: Feb. 18, 2016

(65) Prior Publication Data
US 2017/0077089 A1 Mar. 16, 2017

(30) Foreign Application Priority Data

Sep. 11, 2015 (JP) ................. 2015-180041

(51) Int. Cl.
*H01L 29/66* (2006.01)
*H01L 29/868* (2006.01)
(Continued)

(52) U.S. Cl.
CPC ........ *H01L 29/868* (2013.01); *H01L 27/0727* (2013.01); *H01L 29/0619* (2013.01);
(Continued)

(58) Field of Classification Search
CPC ............ H01L 27/0629; H01L 29/0619; H01L 29/0623; H01L 29/0642; H01L 29/0692;
(Continued)

(56) References Cited

U.S. PATENT DOCUMENTS 5,366,914 A * 11/1994 Takahashi ........... H01L 29/7802
257/E29.146
5,721,148 A * 2/1998 Nishimura .......... H01L 29/1087
148/DIG. 126
(Continued)

FOREIGN PATENT DOCUMENTS

CN 1505173 A 6/2004
CN 103681882 A 3/2014
(Continued)

*Primary Examiner* — Mohammed Shamsuzzaman
(74) *Attorney, Agent, or Firm* — White & Case LLP

(57) ABSTRACT

According to one embodiment, in a semiconductor device, The first semiconductor region is provided between the first and the second electrode. The second semiconductor region is provided between the first semiconductor region and the second electrode. The first and second connection region are electrically connected to the second electrode, reaches the first semiconductor region. The first insulating film is provided between the first connection region and the second semiconductor region and between the first connection region and the first semiconductor region. The second insulating film is provided between the second connection region and the second semiconductor region and between the second connection region and the first semiconductor region. The third connection region is provided between the first connection region and the second connection region, the third connection region is electrically connected to the second electrode, reaches the first semiconductor region or reaches the second semiconductor region.

14 Claims, 12 Drawing Sheets

(51) Int. Cl.
*H01L 29/872* (2006.01)
*H01L 27/07* (2006.01)
*H01L 29/40* (2006.01)
*H01L 29/739* (2006.01)
*H01L 29/861* (2006.01)
*H01L 29/06* (2006.01)
H01L 29/36 (2006.01)
H01L 29/10 (2006.01)
H01L 29/16 (2006.01)
H01L 29/20 (2006.01)

(52) U.S. Cl.
CPC ........ *H01L 29/407* (2013.01); *H01L 29/7397* (2013.01); *H01L 29/8613* (2013.01); *H01L 29/872* (2013.01); H01L 29/0692 (2013.01); H01L 29/1095 (2013.01); H01L 29/1608 (2013.01); H01L 29/2003 (2013.01); H01L 29/36 (2013.01)

(58) Field of Classification Search
CPC . H01L 29/0696; H01L 29/08; H01L 29/0834; H01L 29/0847; H01L 29/0878; H01L 29/1095; H01L 29/1608; H01L 29/20; H01L 29/7393; H01L 29/7397; H01L 29/7806; H01L 29/7813; H01L 29/7839; H01L 29/8611; H01L 29/872; H01L 27/075; H01L 27/0788; H01L 29/868
USPC ................ 257/140, 144, 124, 139, 135, 147
See application file for complete search history.

(56) References Cited

U.S. PATENT DOCUMENTS

| | | | |
|---|---|---|---|
| 8,552,476 B2 | 10/2013 | Ohta et al. | |
| 8,766,317 B2 | 7/2014 | Takaishi | |
| 9,224,844 B2 | 12/2015 | Ogura et al. | |
| 2005/0073030 A1 | 4/2005 | Inoue et al. | |
| 2006/0081903 A1 | 4/2006 | Inoue et al. | |
| 2006/0267090 A1* | 11/2006 | Sapp | H01L 29/7827 257/341 |
| 2010/0264488 A1 | 10/2010 | Hsieh | |
| 2010/0314707 A1 | 12/2010 | Yedinak et al. | |
| 2011/0201187 A1 | 8/2011 | Nishiwaki et al. | |
| 2013/0181254 A1 | 7/2013 | Iwasaki | |
| 2013/0221401 A1* | 8/2013 | Ogura | H01L 29/36 257/139 |
| 2013/0248924 A1* | 9/2013 | Matsudai | H01L 29/7397 257/139 |
| 2014/0048847 A1* | 2/2014 | Yamashita | H01L 29/407 257/140 |
| 2014/0070266 A1* | 3/2014 | Matsudai | H01L 29/7397 257/139 |
| 2014/0145210 A1* | 5/2014 | Suzuki | H01L 21/041 257/77 |
| 2015/0263149 A1 | 9/2015 | Ogura et al. | |
| 2015/0311326 A1 | 10/2015 | Ogura et al. | |
| 2016/0172453 A1* | 6/2016 | Hirabayashi | H01L 29/41708 257/144 |
| 2016/0172471 A1* | 6/2016 | Hirabayashi | H01L 29/7397 257/124 |

FOREIGN PATENT DOCUMENTS

| | | |
|---|---|---|
| JP | 2004-186413 A | 7/2005 |
| JP | 2006-093374 A | 4/2006 |
| JP | 2006-114853 A | 4/2006 |
| JP | 2010-067901 A | 3/2010 |
| JP | 2013-048230 A | 3/2013 |
| JP | 2013-145851 A | 7/2013 |
| JP | 2014-052704 A | 3/2014 |
| JP | 2014-056942 A | 3/2014 |
| TW | 201044596 A | 12/2010 |

* cited by examiner

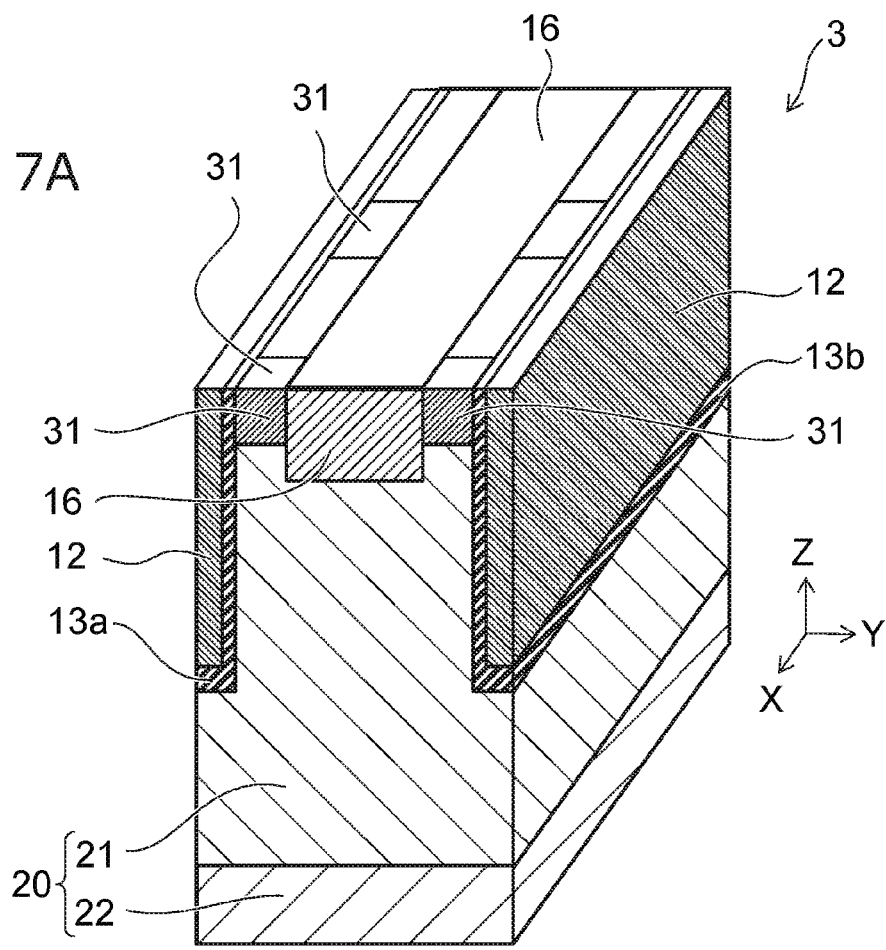
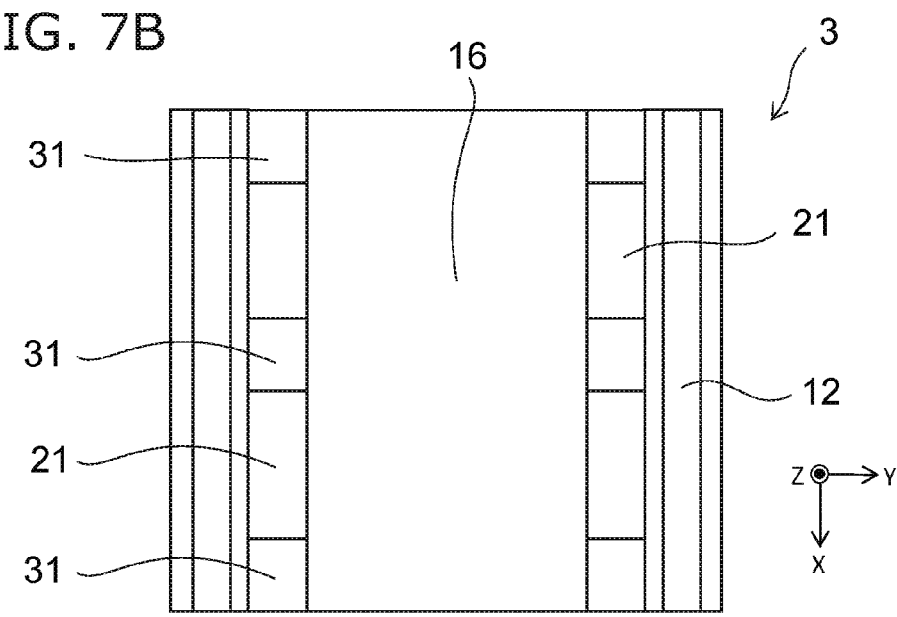

SEMICONDUCTOR DEVICE

CROSS-REFERENCE TO RELATED APPLICATIONS

This application is based upon and claims the benefit of priority from Japanese Patent Application No. 2015-180041, filed on Sep. 11, 2015; the entire contents of which are incorporated herein by reference.

FIELD

Embodiments described herein relate generally to a semiconductor device.

BACKGROUND

An IGBT (Insulated Gate Bipolar Transistor), a diode or the like is used as a semiconductor device used for a power conversion device such as an inverter. The diode is generally connected in reverse parallel to the IGBT and is used as a free wheeling diode. Thus, the diode is sometimes called a FWD (Free Wheeling Diode).

For characteristic improvement of the power conversion device such as an inverter, characteristic improvement of the FWD is important in addition to characteristic improvement of the IGBT. Characteristics to be improved include an ON voltage (voltage drop in a conduction state), a recovery time (extinction time of recovery current at reverse recovery), a safe operation region during recovery (operation region in which damage does not occur even if voltage is applied in a state where reverse recovery current flows), and current and voltage vibration during recovery. Especially, to shorten the recovery time is important. Incidentally, in the following, the reverse recovery is called recovery.

BRIEF DESCRIPTION OF THE DRAWINGS

FIG. 7A is a schematic perspective view showing a semiconductor device according to a third embodiment, FIG. 7B is a schematic plan view showing the semiconductor device according to the third embodiment;

DETAILED DESCRIPTION

Figure 1A:
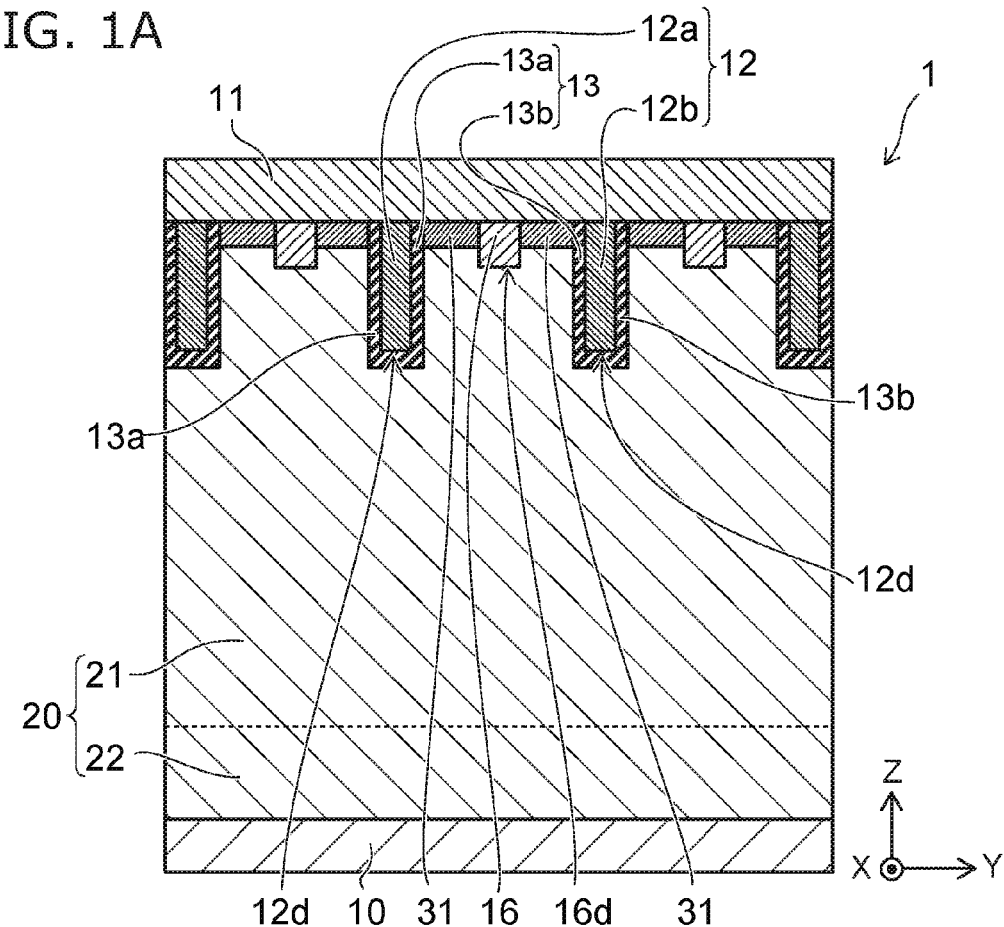
FIG. 1A is a schematic sectional view showing a semiconductor device according to a first embodiment.

According to one embodiment, a semiconductor device includes: a first electrode; a second electrode; a first semiconductor region of first conductivity type; a second semiconductor region of second conductivity type; a first connection region; a second connection region; a first insulating film; a second insulating film; and a third connection region. The first semiconductor region of first conductivity type is provided between the first electrode and the second electrode. The second semiconductor region of second conductivity type is provided between the first semiconductor region and the second electrode. The first connection region is electrically connected to the second electrode, the first connection region reaches the first semiconductor region from the second electrode. The second connection region is electrically connected to the second electrode, the second connection region reaches the first semiconductor region from the second electrode, and the first connection region and the second connection region are arranged in a second direction crossing a first direction from the second electrode toward the first electrode. The first insulating film is provided between the first connection region and the second semiconductor region and between the first connection region and the first semiconductor region. The second insulating film is provided between the second connection region and the second semiconductor region and between the second connection region and the first semiconductor region. And the third connection region is provided between the first connection region and the second connection region in the second direction, the third connection region is electrically connected to the second electrode, and the third connection region reaches the first semiconductor region from the second electrode or reaches the second semiconductor region from the second electrode.

Hereinafter, embodiments will be described with reference to the drawings. In the following description, the same components are denoted by the same reference numerals, and the description of the component once described is appropriately omitted. In the embodiments, an n-type (first conductivity type) impurity concentration becomes low in order of n$^+$-type, n-type and n$^-$-type. A p-type (second conductivity type) impurity concentration becomes low in order of p$^+$-type and p-type. Furthermore, three-dimensional coordinates (X-axis, Y-axis, Z-axis) may be introduced in the drawings.

First Embodiment

Figure 1B:
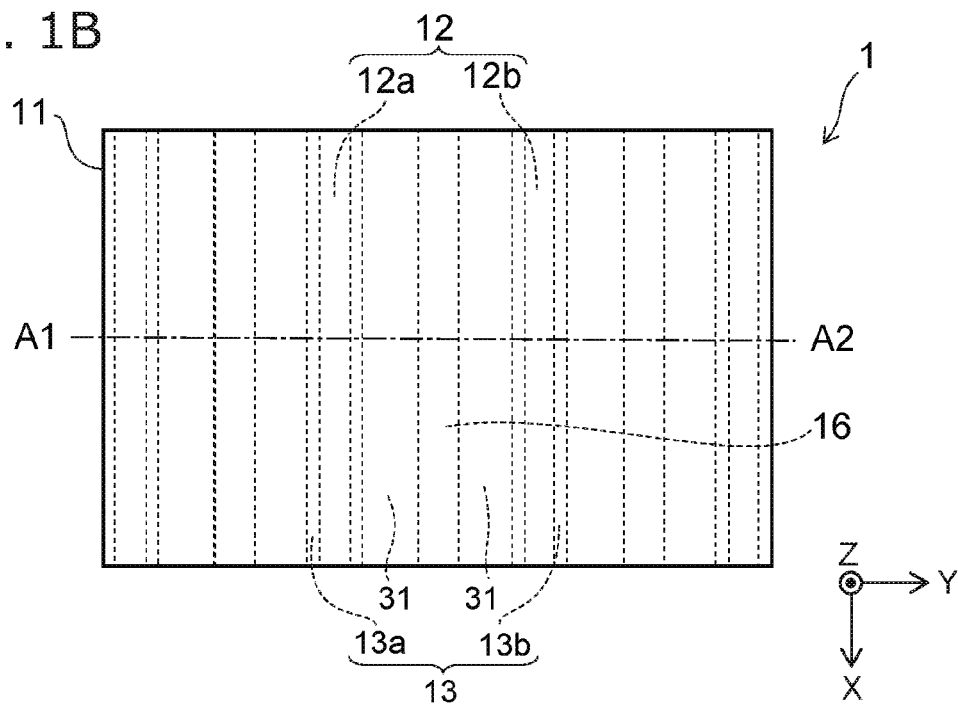
FIG. 1B is a schematic plan view showing the semiconductor device according to the first embodiment.

FIG. 1A is a schematic sectional view showing a semiconductor device according to a first embodiment. FIG. 1B is a schematic plan view showing the semiconductor device according to the first embodiment. FIG. 1A shows a section at a position along line A1-A2 of FIG. 1B.

A semiconductor device 1 shown in FIG. 1A and FIG. 1B is a kind of diode. The semiconductor device 1 is used as, for example, a free wheeling diode of an inverter circuit or the like.

As shown in FIG. 1A, the semiconductor device 1 includes a first electrode 10, a second electrode 11, a first semiconductor region (hereinafter, for example, an n-type semiconductor region 20), a second semiconductor region (hereinafter, for example, a $p^+$-type semiconductor region 31), a first connection region (hereinafter, for example, connection region 12a), a second connection region (hereinafter, for example, connection region 12b), a first insulating film (hereinafter, an insulating film 13a), a second insulating film (hereinafter, an insulating film 13b), and a third connection region (hereinafter, for example, a connection region 16). In the embodiment, the connection region 12a or the connection region 12b may be collectively called the connection region 12. In the embodiment, the insulating film 13a or the insulating film 13b may be collectively called the insulating film 13.

In the three-dimensional coordinates shown in the drawing in the embodiment, a direction directed from the first electrode 10 to the second electrode 11 corresponds to a Z-axis direction, one of directions crossing the Z-axis direction corresponds to an X-axis direction, and a direction crossing the Z-axis direction and the X-axis direction corresponds to a Y-axis direction.

The n-type semiconductor region 20 is provided between the first electrode 10 and the second electrode 11 in the semiconductor device 1. The first electrode 10 is a cathode electrode. The second electrode 11 is an anode electrode. Plural semiconductor regions are provided between the first electrode 10 and the second electrode 11. For example, the n-type semiconductor region 20 includes an $n^-$-type semiconductor region 21 and an $n^+$-type semiconductor region 22. The $n^+$-type semiconductor region 22 is provided between the first electrode 10 and the $n^-$-type semiconductor region 21. The $n^+$-type semiconductor region 22 is provided on a side of the first electrode 10. The $n^-$-type semiconductor region 21 is provided on a side of the second electrode 11. The $n^+$-type semiconductor region 22 is in ohmic contact or low-resistance contact with the first electrode 10.

The $p^+$-type semiconductor region 31 is provided between the n-type semiconductor region 20 and the second electrode 11. The $p^+$-type semiconductor region 31 is divided by the plural connection regions 12 (e.g. connection region 12a or connection region 12b) in the Y-axis direction. The $p^+$-type semiconductor region 31 is provided between the adjacent connection regions 12 (e.g. connection region 12a or connection region 12b) in the Y-axis direction. The $p^+$-type semiconductor region 31 is divided by the connection region 16. The $p^+$-type semiconductor region 31 is in ohmic contact or low-resistance contact with the second electrode 11. In the semiconductor device 1, a pin diode is formed of the $p^+$-type semiconductor region 31/the $n^-$-type semiconductor region 21/the $n^+$-type semiconductor region 22. A junction portion between the $p^+$-type semiconductor region 31 and the $n^-$-type semiconductor region 21, that is, a p-n junction is positioned between one of the plural connection regions 12 (e.g. connection region 12a or connection region 12b) and the connection region 16. The plural $p^+$-type semiconductor regions 31 are provided on the n-type semiconductor region 20. The $p^+$-type semiconductor region 31 is formed by selective injection of p-type impurities into the $n^-$-type semiconductor region 21 and by an anneal process after the injection of p-type impurities.

Each of the plural connection regions 12 is electrically connected to the second electrode 11. Here, "connection" includes indirect connection in addition to direction connection. For example, each of the plural connection regions 12 contacts the second electrode 11. Each of the plural connection regions 12 reaches the n-type semiconductor region 20 from the second electrode 11.

For example, the connection region 12a is electrically connected to the second electrode 11, and reaches the n-type semiconductor region 20 from the second electrode 11. The connection region 12b is electrically connected to the second electrode 11, and reaches the n-type semiconductor region 20 from the second electrode 11. The connection region 12a and the connection region 12b are arranged in the Y-axis direction.

For example, each of the plural connection regions 12 extends in the $p^+$-type semiconductor region 31 and in the n-type semiconductor region 20 in a direction (first direction) directed from the second electrode 11 to the first electrode 10. A lower end 12d of each of the plural connection regions 12 is positioned in the $n^-$-type semiconductor region 21.

The insulating film 13 is provided between each of the plural connection regions 12 and the $p^+$-type semiconductor region 31 and between each of the plural connection regions 12 and the n-type semiconductor region 20 (for example, the $n^-$-type semiconductor region 21).

For example, the insulating film 13a is provided between the connection region 12a and the $p^+$-type semiconductor region 31 and between the connection region 12a and the n-type semiconductor region 20 (for example, the $n^-$-type semiconductor region 21). The insulating film 13b is provided between the connection region 12b and the $p^+$-type semiconductor region 31 and between the connection region 12b and the n-type semiconductor region 20 (for example, the $n^-$-type semiconductor region 21).

The plural connection regions 12 are arranged in, for example, a second direction (Y-axis direction) crossing the first direction. For example, the insulating film 13, the $n^-$-type semiconductor region 21, the $p^+$-type semiconductor region 31 and the connection region 16 are provided between a connection region 12a and a connection region 12b adjacent to each other among the plural connection regions 12. Distances between the first electrode 10 and the respective lower ends 12d of the connection regions 12 are substantially the same.

The connection region 16 is provided between the connection region 12a and the connection region 12b in the Y-direction. The connection region 16 is electrically connected to the second electrode 11. The connection region 16 contacts, for example, the second electrode 11. The connection region 16 reaches the n-type semiconductor region 20 from the second electrode 11. For example, the connection region 16 extends in the $p^+$-type semiconductor region 31 and in the n-type semiconductor region 20 in the direction directed from the second electrode 11 to the first electrode 10. The connection region 16 pierces the $p^+$-type semiconductor region 31. A lower end 16d of the connection region 16 is positioned in the $n^-$-type semiconductor region 21. The connection region 16 is in Schottky contact with the $n^-$-type semiconductor region 21. In the semiconductor device 1, an SBD (Schottky barrier diode) is formed of the connection region 16/the $n^-$-type semiconductor region 21. That is, the semiconductor device 1 includes the SBD in addition to the pin diode.

The distance between the lower end 16d of the connection region 16 and the first electrode 10 is longer than the distance between the lower end 12d of the connection region 12 (e.g. connection region 12a or connection region 12b) and the first electrode 10. The p+-type semiconductor region 31 is provided between the connection region 16 and each of the plural connection regions 12 in the Y-axis direction.

After the p+-type semiconductor region 31 is formed on the n−-type semiconductor region 21, a trench is formed in the p+-type semiconductor region 31 and the n−-type semiconductor region 21, and the connection region 16 is formed in the trench.

As shown in FIG. 1B, the p+-type semiconductor region 31, the plural connection regions 12 and the connection region 16 extend in a third direction (X-axis direction) crossing the first direction and the Y-axis direction in the semiconductor device 1.

Here, ends of the p+-type semiconductor regions 31 adjacent to each other may be connected to each other on the X-Y plane. Furthermore, ends of the adjacent connection regions 12 may be connected to each other on the X-Y plane. Furthermore, ends of the connection regions 16 adjacent to each other may be connected to each other on the X-Y plane. In the embodiment, the section of the main part of the semiconductor device 1 and the plane of the main part of the semiconductor device 1 are exemplified. For example, when the ends of the adjacent connection regions 12 are connected to each other, the respective connection region portions exemplified on the section of FIG. 1A are defined as the plural connection regions 12.

The distance between the respective centers of the adjacent connection regions 12 in the Y-axis direction is, for example, 6 μm or less, the width of the p+-type semiconductor region 31 is, for example, 2 μm or less, and the width of the connection region 16 is, for example, 2 μm or less.

The main component of the respective semiconductor regions (the n-type semiconductor region 20, the p+-type semiconductor region 31, respective semiconductor regions of the second and following embodiments, etc.) in the embodiment is, for example, silicon (Si). The main component of the semiconductor regions may be silicon carbide (SiC), gallium nitride (GaN) or the like. The first conductivity type impurity element includes, for example, phosphorus (P) and arsenic (As). The second conductivity type impurity element includes, for example, boron (B).

The maximum value of the impurity concentration of the n+-type semiconductor region 22 is larger than $3 \times 10^{17}$ cm$^{-3}$ and is, for example, $1 \times 10^{18}$ cm$^3$ or more. The impurity concentration of the n+-type semiconductor region 22 may be set to become high toward the first electrode 10. The impurity concentration of the n−-type semiconductor region 21 is, for example, $1 \times 10^{15}$ cm$^{-3}$ or less and can be set to an arbitrary impurity concentration according to the breakdown voltage design of the device. The maximum value of the impurity concentration of the p+-type semiconductor region 31 is higher than $3 \times 10^{17}$ cm$^{-3}$ and is, for example, $1 \times 10^{19}$ cm$^{-3}$ or more. The impurity concentration of the p+-type semiconductor region 31 may be set to become high toward the second electrode 11.

The "impurity concentration" means the effective concentration of impurity elements contributing to the conductivity of a semiconductor material. For example, when the semiconductor material includes impurity elements as donors and impurity elements as acceptors, a concentration obtained by removing donors and acceptors, which are canceled with each other, from activated impurity elements is the effective impurity concentration. The concentration of electrons or holes ionized from the effective impurity elements is a carrier concentration. The magnitude of the impurity concentration in the embodiment is compared using the maximum value or average value of an impurity concentration profile in the Z-direction.

The material of the first electrode 10, the second electrode 11 and the connection regions 12 and 16 is, for example, a metal including at least one selected from the group of aluminum (Al), titanium (Ti), nickel (Ni), tungsten (W), gold (Au) and polysilicon. The insulating film includes, for example, silicon oxide ($SiO_2$) or silicon nitride ($Si_3N_4$).

A conduction state of the semiconductor device 1 will be described.

Figure 2A:
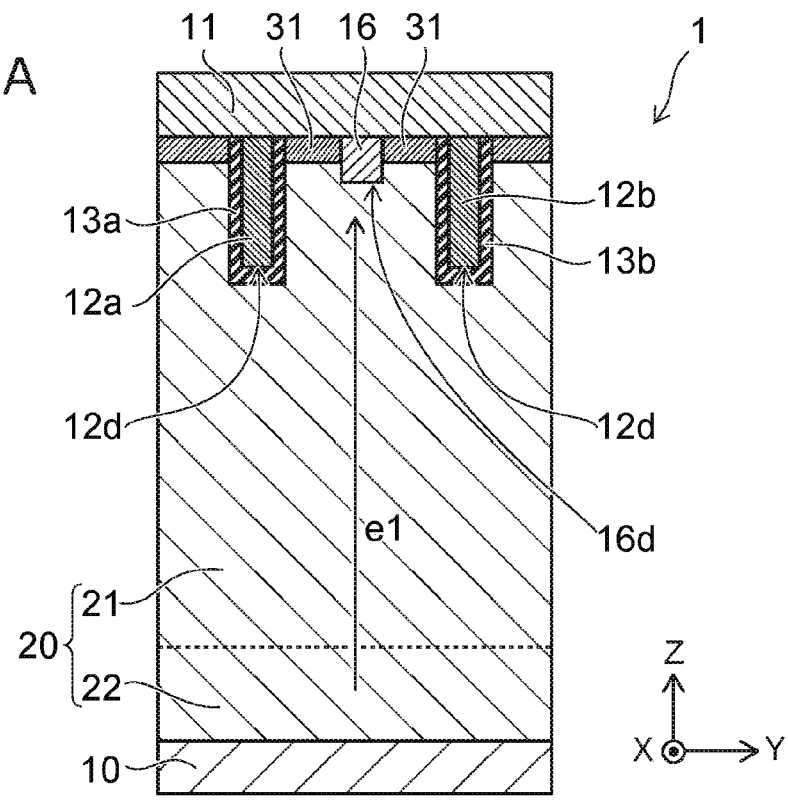
FIG. 2A and FIG. 2B are schematic sectional views showing a conduction state of the semiconductor device according to the first embodiment.
Figure 2B:
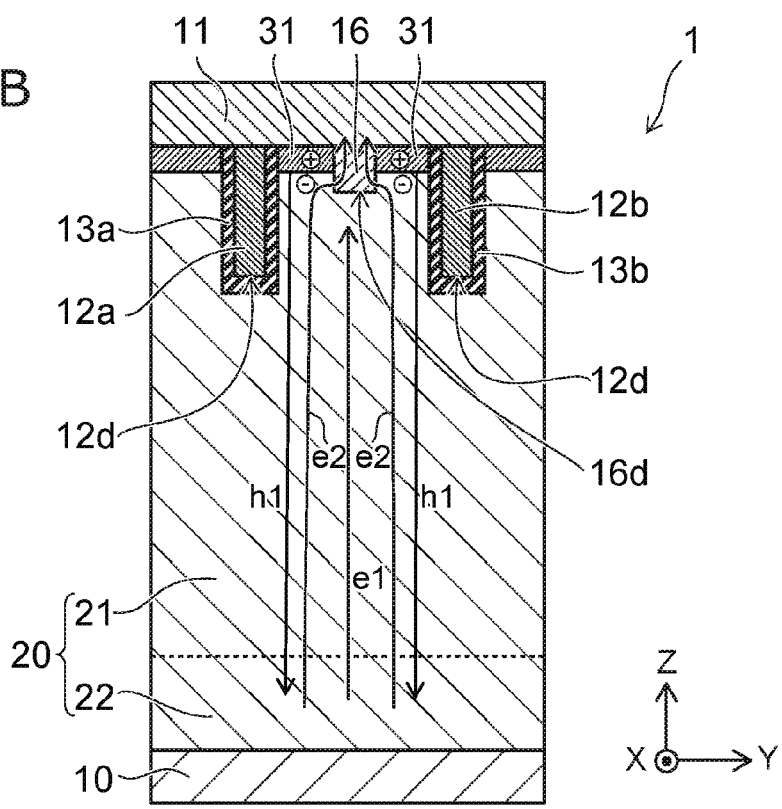
Figure 3:
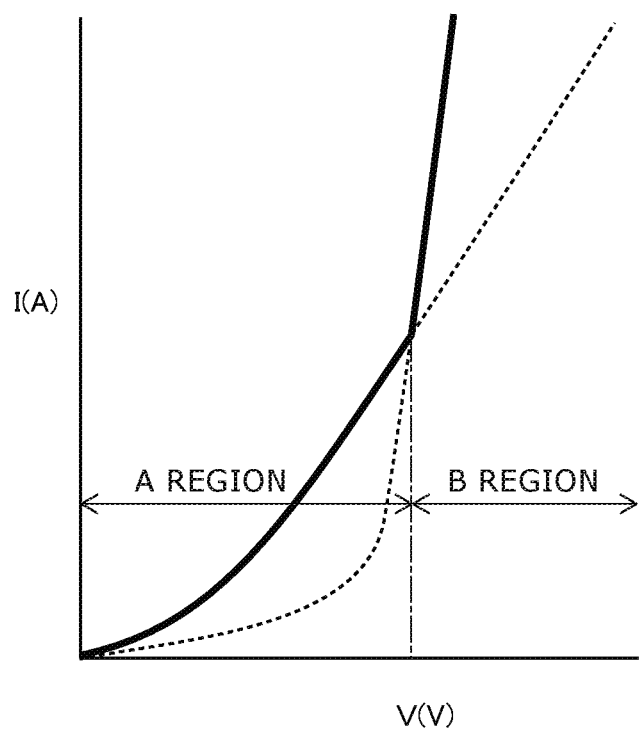
FIG. 3 is a graph showing a conduction state of the semiconductor device according to the first embodiment.

FIG. 2A and FIG. 2B are schematic sectional views showing the conduction state of the semiconductor device according to the first embodiment. FIG. 3 is a graph showing the conduction state of the semiconductor device according to the first embodiment. The horizontal axis of FIG. 3 indicates voltage (V) applied between the first electrode 10 and the second electrode 11, and the vertical axis indicates current (A) flowing between the first electrode 10 and the second electrode 11.

FIG. 2A shows a low current conduction state in the semiconductor device 1.

In the low current conduction state, a forward bias voltage is applied between cathode and anode. That is, the voltage is applied between the cathode and anode, so that the potential of the second electrode 11 becomes higher than the potential of the first electrode 10. For example, the second electrode 11 is a positive electrode, and the first electrode 10 is a negative electrode.

The n+-type semiconductor region 22 is in ohmic contact or low resistance contact with the first electrode 10. Accordingly, an electron injected from the first electrode 10 reaches the n-type semiconductor region 21 between the adjacent connection regions 12 through the n+-type semiconductor region 22. Here, the energy barrier of the Schottky barrier of the SBD is set to be lower than the energy barrier of the p-n junction barrier of the pin diode. Thereby, most of the electrons flow to the second electrode 11 through the connection region 16, not the p+-type semiconductor region 31. In FIG. 2A, this state is represented by an electron current e1. FIG. 3 shows an I-V curve in the low current conduction state as a curve in an A region. That is, the SBD with higher rising current than the pin diode is operated with priority in the low current conduction state.

FIG. 2B shows a large current conduction state in the semiconductor device 1.

The forward bias voltage also is applied between the cathode and anode in the large current conduction state. However, the forward bias voltage in the large current conduction state is larger than the forward bias voltage in the low current conduction state.

When the forward bias voltage rises even more from the low current conduction state, the amount of electrons injected from the cathode side increases, and the amount of electrons reaching the n-type semiconductor region 21 between the adjacent connection regions 12 increases. The flow of the electrons is represented by an electron current e2. Thereby, the electrons reach not only the vicinity of the connection region 16 but also a portion just below the p+-type semiconductor region 31. However, a junction between the p-type high concentration region (the p+-type semiconductor region 31) and the n-type low concentration region (the n−-type semiconductor region 21) becomes an energy barrier for electrons. Accordingly, the electron reaching the portion just below the p+-type semiconductor region 31 is hard to flow into the p+-type semiconductor region 31. As a result, the electron moves in a lateral direction under the p+-type semiconductor region 31 after reaching the portion just below the p+-type semiconductor region 31, that is, the electron moves in a direction substantially parallel to the Y-axis direction.

By the movement of the electron, a voltage drop occurs under the p+-type semiconductor region 31. Thereby, the p+-type semiconductor region 31 contacting the second electrode 11 is biased to become a positive electrode, and the n−-type semiconductor region 21 positioned below the p+-type semiconductor region 31 is biased to become a negative electrode relative to the p+-type semiconductor region 31.

By this bias, an energy barrier to a hole between the p+-type semiconductor region 31 and the n−-type semiconductor region 21 is decreased. As a result, a hole is injected from the p+-type semiconductor region 31 to the n−-type semiconductor region 21. A hole current h1 is composed of the injected hole.

FIG. 3 shows an I-V curve in the large current conduction state as a curve in a B region. In the large current state, the pin diode operates with priority over the SBD. The hole current h1 in the large current conduction state increases as the width of the p+-type semiconductor region 31 in the Y-axis direction or the contact area between the p+-type semiconductor region 31 and the second electrode 11 becomes large. In other words, the hole injection amount from the anode side is suppressed by controlling the width or the contact area.

The connection region 16 pierces the p+-type semiconductor region 31 in the semiconductor device 1. The width of the p+-type semiconductor region 31 in the Y-axis direction or the contact area between the p+-type semiconductor region 31 and the second electrode 11 can be certainly controlled by adjusting the width of the connection region 16 in the Y-axis direction or the pitch of the connection region 12 in the Y-axis direction. The hole injection in the conduction state can be certainly suppressed by controlling the width of the p+-type semiconductor region 31 or the contact area between the p+-type semiconductor region 31 and the second electrode 11 to be minute. Thereby, recovery time becomes short, and speed up is realized in the semiconductor device 1.

The SBD operates with priority over the pin diode in the low current conduction state in the semiconductor device 1. Thereby, the current at the time of low voltage application increases as compared to the pin diode. As a result, the voltage in the conduction state is reduced in the semiconductor device 1.

An off state of the semiconductor device 1 will be described.

Figure 4A:
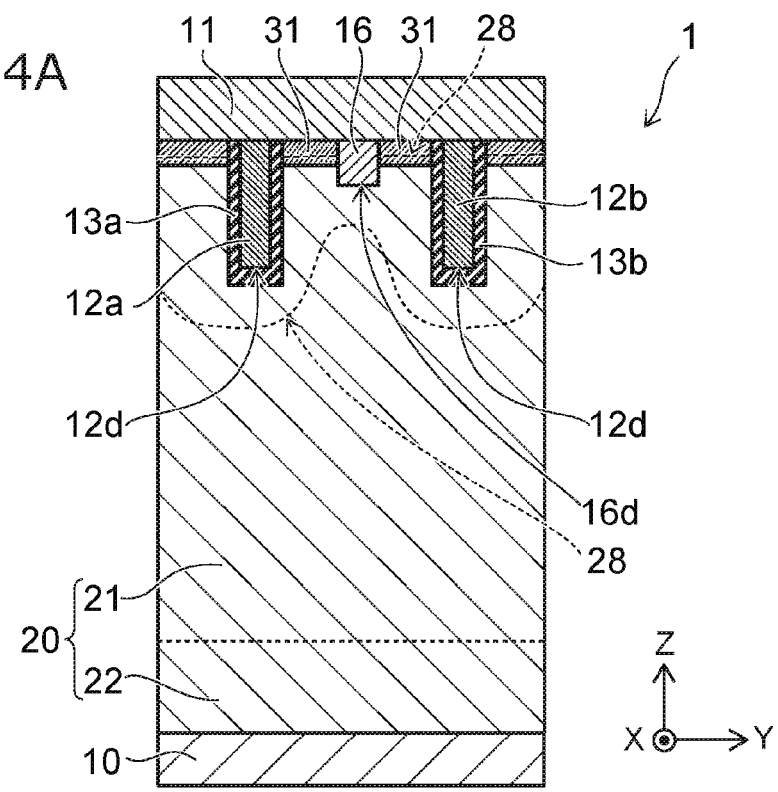
FIG. 4A and FIG. 4B are schematic sectional views showing an off state of the semiconductor device according to the first embodiment.
Figure 4B:
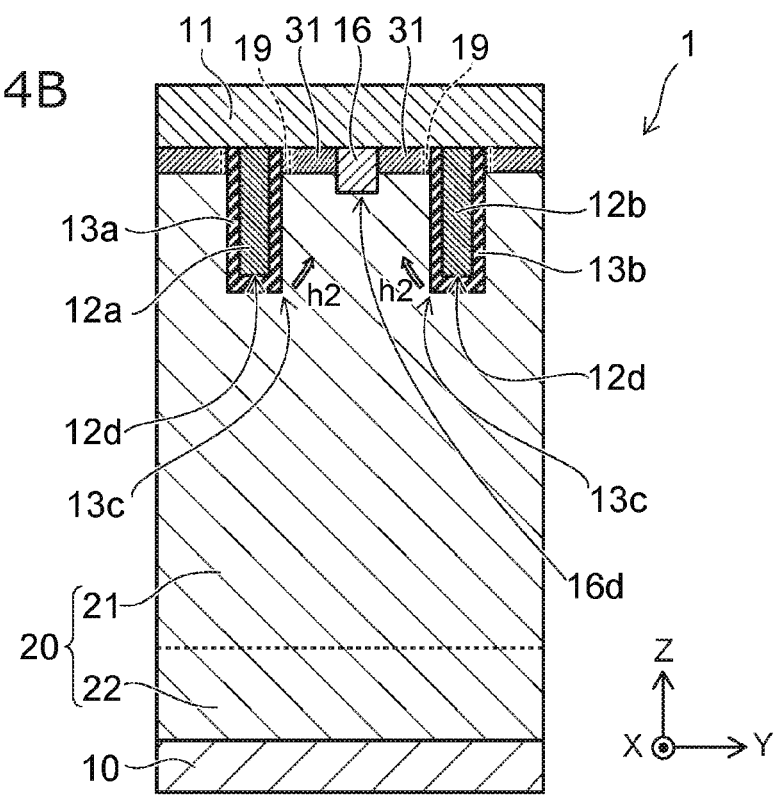

FIG. 4A and FIG. 4B are schematic sectional views showing the off state of the semiconductor device according to the first embodiment.

FIG. 4A shows a recovery state as an example of the off state of the semiconductor device according to the first embodiment.

For example, a reverse bias is applied from the state where the forward bias is applied between the anode and cathode. That is, a voltage is applied between the cathode and anode so that the second electrode 11 becomes a negative electrode and the first electrode 10 becomes a positive electrode. Thereby, a hole existing in the n−-type semiconductor region 21 moves to a side of the second electrode 11. An electron existing in the n−-type semiconductor region 21 moves to a side of the first electrode 10. The electron flows into the first electrode 10 through the n+-type semiconductor region 22. On the other hand, the hole flows into the second electrode 11 through the p+-type semiconductor region 31 and the connection region 16.

During recovery, an electron flows to the first electrode 10, a hole flows to the second electrode 11, and a depletion layer 28 extends in the n−-type semiconductor region 21 and the p+-type semiconductor region 31 from a junction portion between the p+-type semiconductor region 31 and the n−-type semiconductor region 21, a junction portion between the connection region 16 and the n−-type semiconductor region 21, and a junction portion between the insulating film 13 and the n−-type semiconductor region 21. Thereby, conduction between the second electrode 11 and the first electrode 10 in the semiconductor device 1 is cut off.

Here, the depletion layers 28 extending from the junction portions between the n−-type semiconductor region 21 and the insulating films 13 adjacent to each other in the Y-axis direction overlap to each other in the Y-axis direction. Thereby, the n−-type semiconductor region 21 between the adjacent connection regions 12 is completely depleted. As a result, the reverse bias applied to the SBD is relaxed, and reverse current (leak current) flowing in the SBD is certainly suppressed. Thereby, in the semiconductor device 1, the breakdown voltage in the off state is certainly improved.

FIG. 4B shows another example of a recovery state as an example of an off state of the semiconductor device according to the first embodiment.

In the pin diode, electric field concentration may occur at a portion near the p-n junction during recovery, and avalanche may occur at the portion. However, the insulating film 13 has a corner part 13c on a side of the first electrode 10. An electric field concentrates on the corner part 13c during recovery, and avalanche is liable to occur in the vicinity of the corner part 13c. A hole flow generated by the avalanche is denoted by a hole h2.

Here, the corner part 13c is repeatedly disposed in the Y-axis direction. Thereby, the avalanche is liable to occur at each of the plural corner parts 13c, and the position where the avalanche occurs is distributed into plural positions. The hole current h2 is discharged to the second electrode 11 through the p+-type semiconductor region 31 near the corner part 13c. In the semiconductor device 1, since the hole flows into the second electrode 11 through the p+-type semiconductor region 31, damage caused by the avalanche is suppressed, and a safe operation region during recovery is enlarged.

Furthermore, the same negative potential as that applied to the second electrode 11 is applied to the connection region 12 during recovery. Thereby, an induction layer 19 in which hole concentration is increased is formed in the p+-type semiconductor region 31 along the insulating film 13. The induction layer 19 is a low resistance layer for the hole. The hole is efficiently discharged to the second electrode 11 by the formation of the induction layer 19. Thereby, the breakdown strength of the semiconductor device 1 during recovery is further increased.

Figure 5A:
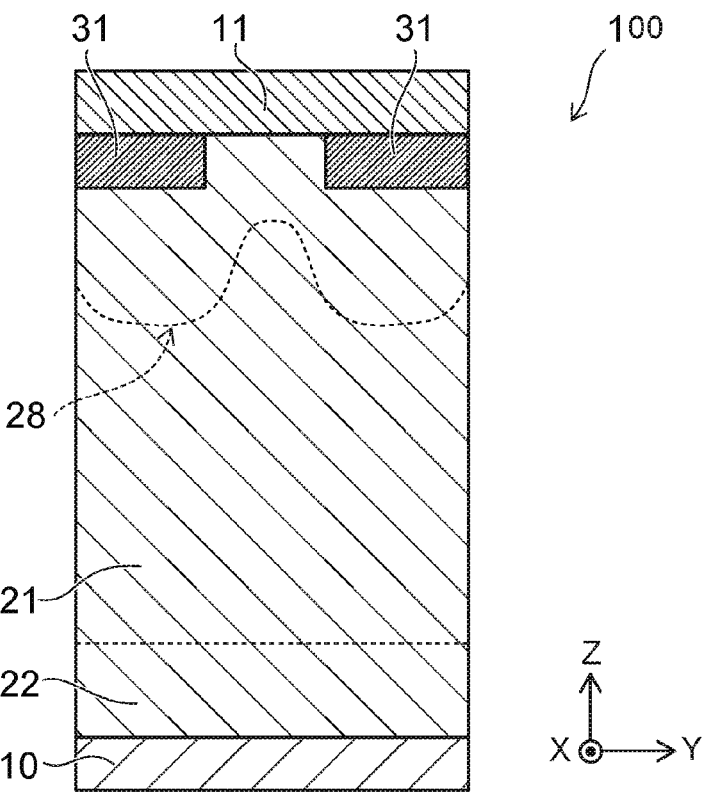
FIG. 5A is a schematic sectional view showing a semiconductor device according to a first reference example.
Figure 5B:
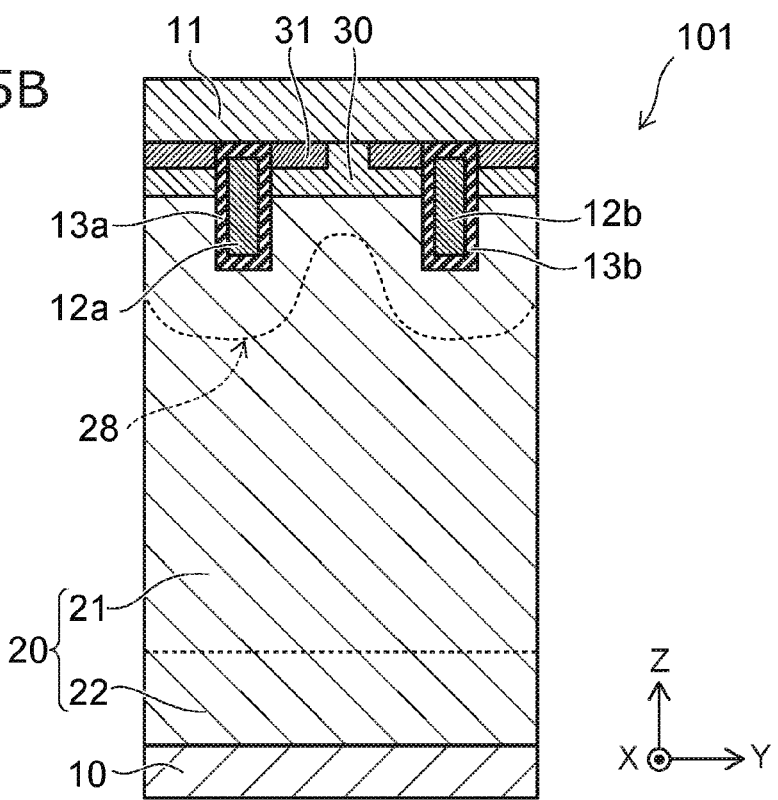
FIG. 5B is a schematic sectional view showing a semiconductor device according to a second reference example.

FIG. 5A is a schematic sectional view showing a semiconductor device according to a first reference example. FIG. 5B is a schematic sectional view showing a semiconductor device according to a second reference example.

In a semiconductor device 100 of the first reference example shown in FIG. 5A, merely plural p+-type semiconductor regions 31 are provided between an n-type semiconductor region 20 and a second electrode 11. Furthermore, an n−-type semiconductor region 21 is in Schottky contact with the second electrode 11.

Also in the semiconductor device 100, in an off state, a depletion layer 28 extends from junction portions between the n⁻-type semiconductor region 21 and the p⁺-type semiconductor regions 31 adjacent to each other, and the n⁻-type semiconductor region 21 between the p⁺-type semiconductor regions 31 adjacent to each other is completely depleted. As a result, a reverse bias applied to the SBD is relaxed, and reverse current flowing in the SBD is suppressed.

However, the p⁺-type semiconductor region 31 is required to be deepened in order to completely deplete the n⁻-type semiconductor region 21 between the p⁺-type semiconductor regions 31 adjacent to each other. Thereby, the volume of the p⁺-type semiconductor region 31 is increased in the semiconductor device 100. Furthermore, the p⁺-type semiconductor region 31 may be thermally diffused in manufacturing process. As a result, hole injection in the conduction state increases in the semiconductor device 100.

On the other hand, in the semiconductor device 1, the depth of the p⁺-type semiconductor region 31 is not deepened, but the plural connection regions 12 are deepened, so that the n⁻-type semiconductor region 21 between the adjacent connection regions 12 is completely depleted. Furthermore, since the connection region 16 pierces the p⁺-type semiconductor region 31, the width of the p⁺-type semiconductor region 31 in the Y-axis direction is controlled to be minute. Thereby, the hole injection amount in the conduction state is reduced, and the recovery time is further shortened.

On the other hand, a semiconductor device 101 of the second reference example shown in FIG. 5B has a configuration in which the connection region 16 is removed from the semiconductor device 1. Further, in the semiconductor device 101, a p-type semiconductor region 30 is provided between a second electrode 11 and an n-type semiconductor region 21 and between a p⁺-type semiconductor region 31 and the n⁻-type semiconductor region 21.

Also in the semiconductor device 101, in an off state, a depletion layer 28 extends in the n⁻-type semiconductor region 21 and the p-type semiconductor region 30 from a junction portion between the p-type semiconductor region 30 and the n⁻-type semiconductor region 21 and a junction portion between an insulating film 13 and the n⁻-type semiconductor region 21. The depletion layers 28 extending from the junction portions between the n⁻-type semiconductor region 21 and the insulating films 13 adjacent to each other in the Y-axis direction are connected to each other in the Y-axis direction. Thereby, the n⁻-type semiconductor region 21 between the adjacent connection regions 12 is completely depleted. Thereby, in the semiconductor device 101, the breakdown voltage in the off state is improved.

However, the semiconductor device 101 does not include the connection region 16 and does not include the SBD. Thereby, the on voltage in the low current conduction state is increased as compared to the semiconductor device 1. Furthermore, the p⁺-type semiconductor region 31 may be thermally diffused in manufacturing process. Thereby, in the semiconductor device 101, the width of the p⁺-type semiconductor region 31 in the Y-axis direction can not be controlled to be minute.

On the other hand, in the semiconductor device 1, the on voltage in the low current conduction state is decreased by use of the SBD. Further, since the connection region 16 pierces the p⁺-type semiconductor region 31, the width of the p⁺-type semiconductor region 31 in the Y-axis direction can be controlled to be minute. Thereby, the hole injection amount in the conduction state is reduced, and the recovery time is further shortened.

Second Embodiment

Figure 6:
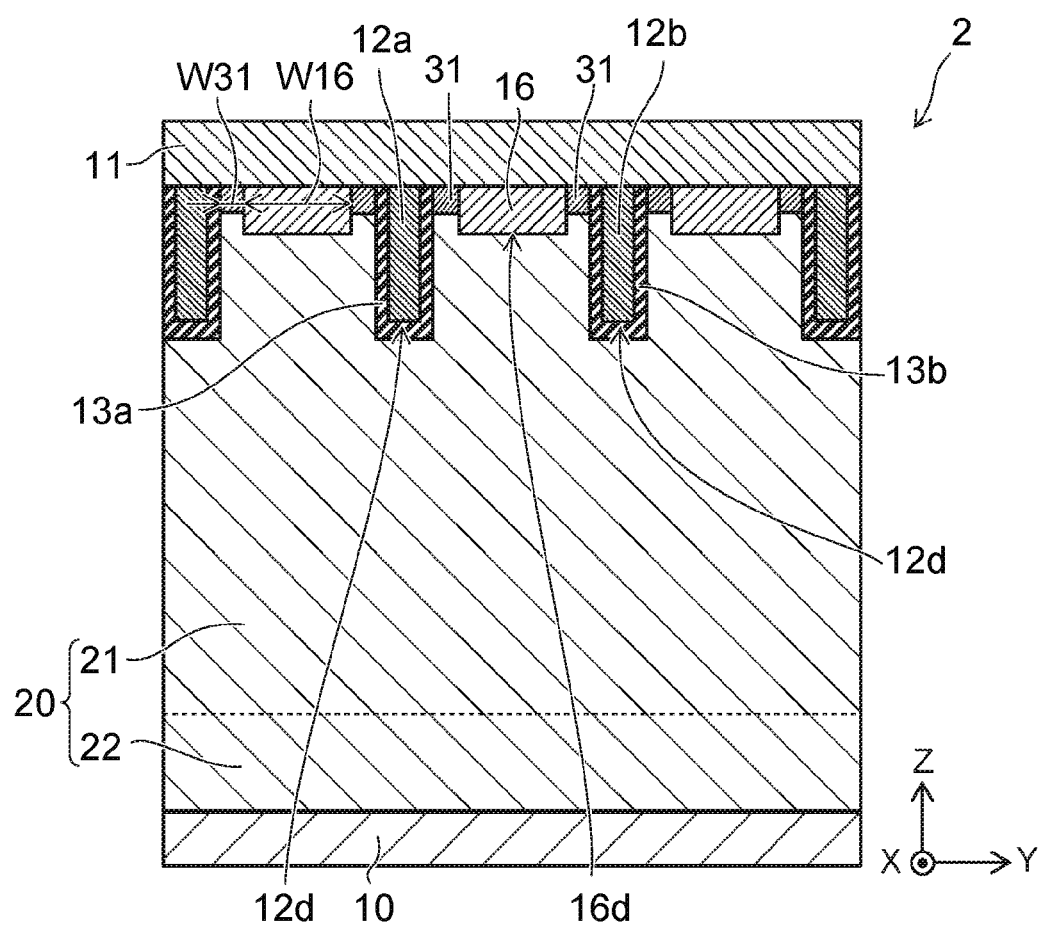
FIG. 6 is a schematic sectional view showing a semiconductor device according to a second embodiment.

FIG. 6 is a schematic sectional view showing a semiconductor device according to a second embodiment.

In a semiconductor device 2 shown in FIG. 6, a width W16 of a connection region 16 in a Y-axis direction is larger than a width W31 of a p⁺-type semiconductor region 31 between an insulating film 13 (e.g. insulating film 13a or insulating film 13b) and the connection region 16. The width of the p⁺-type semiconductor region 31 is, for example, 0.1 μm to 1 μm, and the width of the connection region 16 is, for example, 0.2 μm to 2 μm. Thereby, in a conduction state, the hole injection from the p⁺-type semiconductor region 31 is suppressed, and the recovery time is further shortened in the semiconductor device 2.

Third Embodiment

FIG. 7A is a schematic perspective view showing a semiconductor device according to a third embodiment. FIG. 7B is a schematic plan view showing the semiconductor device according to the third embodiment. In FIG. 7A, a first electrode 10 and a second electrode 11 are not shown.

In a semiconductor device 3 shown in FIGS. 7A and 7B, a p⁺-type semiconductor region 31 is divided into plural regions in the X-axis direction (third direction) crossing the Z-axis direction and the Y-axis direction. For example, in the X-axis direction, the p⁺-type semiconductor region 31 and an n⁻-type semiconductor region 21 are alternately arranged. In the Y-axis direction, a width of a connection region 16 may be larger than a width of the p⁺-type semiconductor region 31 positioned between the connection region 16 and an insulating film 13 (e.g. insulating film 13a or insulating film 13b). The configuration as stated above is adopted, so that the hole injection from the p⁺-type semiconductor region 31 is further suppressed in a conduction state, and the recovery time is further shortened.

Fourth Embodiment

Figure 8A:
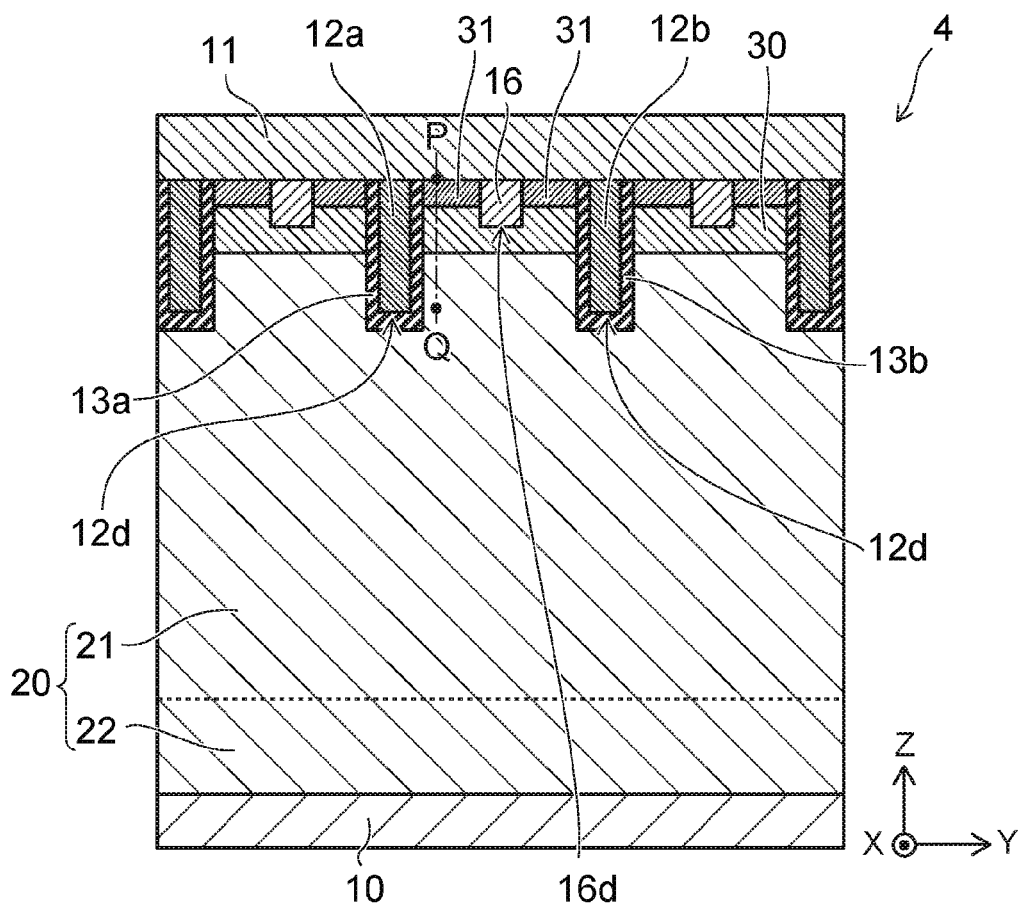
FIG. 8A is a schematic sectional view showing a semiconductor device according to a fourth embodiment.
Figure 8B:
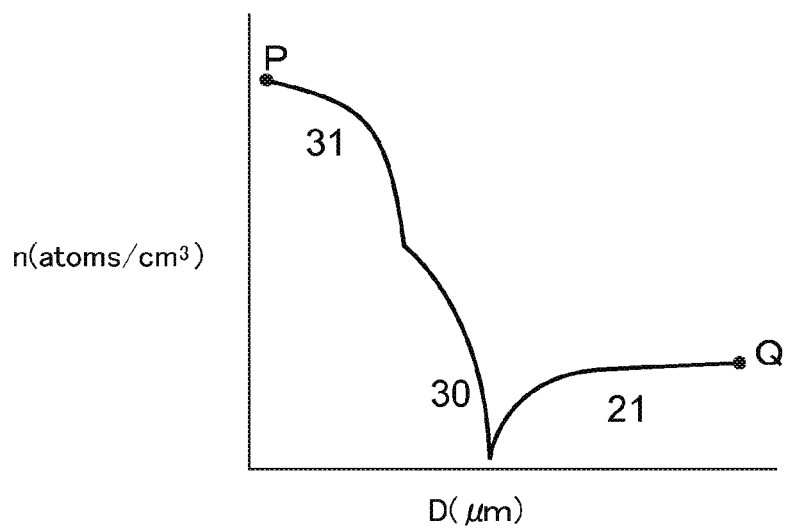
FIG. 8B is a graph showing an impurity concentration profile in a portion of the semiconductor device according to the fourth embodiment.

FIG. 8A is a schematic sectional view showing a semiconductor device according to a fourth embodiment. FIG. 8B is a graph showing an impurity concentration profile in a portion of the semiconductor device according to the fourth embodiment. The horizontal axis of FIG. 8B indicates depth (m) from a point P of FIG. 8A in the Z-axis direction, and the vertical axis indicates impurity concentration (atoms/cm³).

A semiconductor device 4 shown in FIG. 8A includes a p-type semiconductor region 30 between an n⁻-type semiconductor region 21 and a p⁺-type semiconductor region 31. The maximum value of the impurity concentration of the p-type semiconductor region 30 is, for example, 1×10¹⁶ cm⁻³ or less, and is low. In the semiconductor device 4, a junction portion between the p-type semiconductor region 30 and the n⁻-type semiconductor region 21, that is, a p-n junction is positioned between a first electrode 10 and a connection region 16. The p-n junction is positioned between the adjacent connection regions 12 (e.g. connection region 12a and connection region 12b) in the Y-direction.

When a region includes the p⁺-type semiconductor region 31 and the p-type semiconductor region 30 is regarded as a p-type second semiconductor region, the impurity concentration of the second semiconductor region on a side of the first electrode 10 is lower than the impurity concentration on a side of the second electrode 11 (FIG. 8B). For example, the impurity concentration of the p-type second semiconductor region on the side of the first electrode 10 is lower than the impurity concentration on the side of the second electrode 11 between one of the connection regions 12 (e.g. connection region 12a or connection region 12a) and the connection region 16. The connection region 16 reaches the inside of the second semiconductor region from the second electrode 11. For example, the connection region 16 extends in the second semiconductor region from the second electrode 11 to the first electrode 10. The connection region 16 excepts for a portion connected to the second electrode 11 is surrounded by the second semiconductor region.

The p-type semiconductor region 30 of low concentration is provided between the n⁻-type semiconductor region 21 and the p⁺-type semiconductor region 31. Thus, a depletion layer extends also from a junction portion between the p-type semiconductor region 30 and the n⁻-type semiconductor region 21 in an off state in the semiconductor device 4. Thereby, the breakdown voltage in the off state is further increased. Furthermore, since the p-type semiconductor region 30 is the low concentration region, the region does not influence the rise of current in the low current conduction state. Thereby, an on-voltage is reduced in the semiconductor device 4.

Fifth Embodiment

Figure 9A:
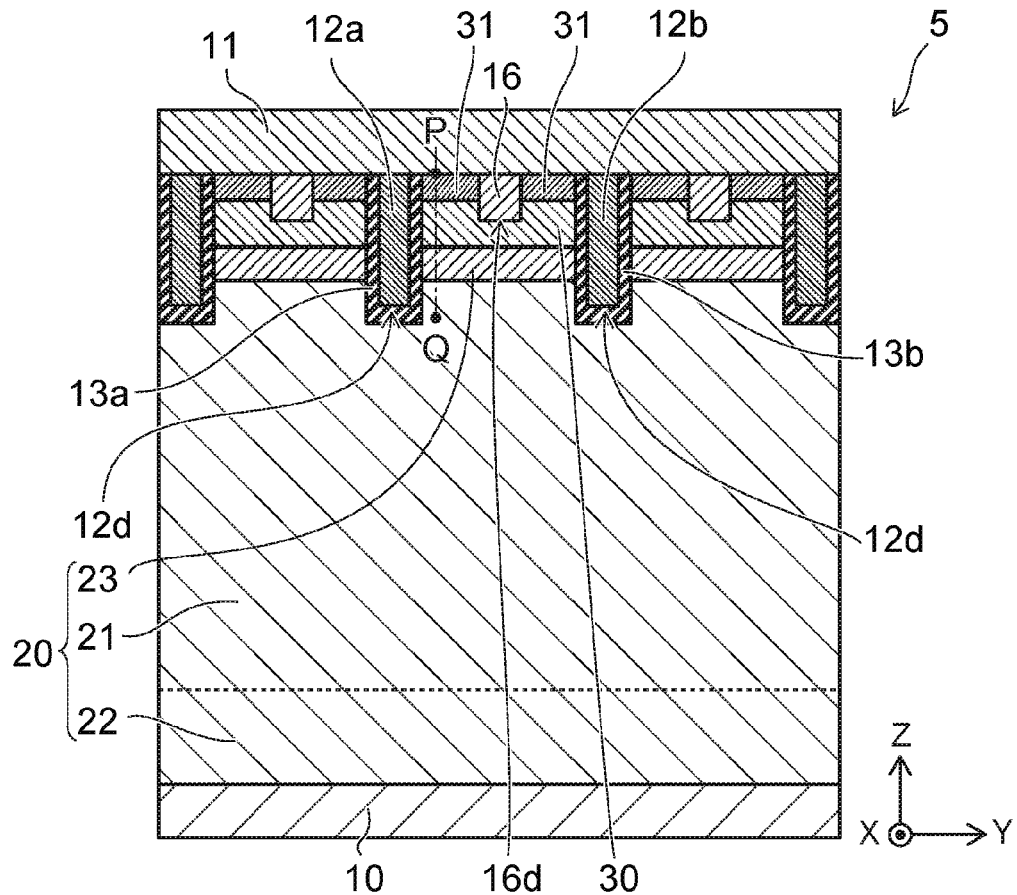
FIG. 9A is a schematic sectional view showing a semiconductor device according to a fifth embodiment.
Figure 9B:
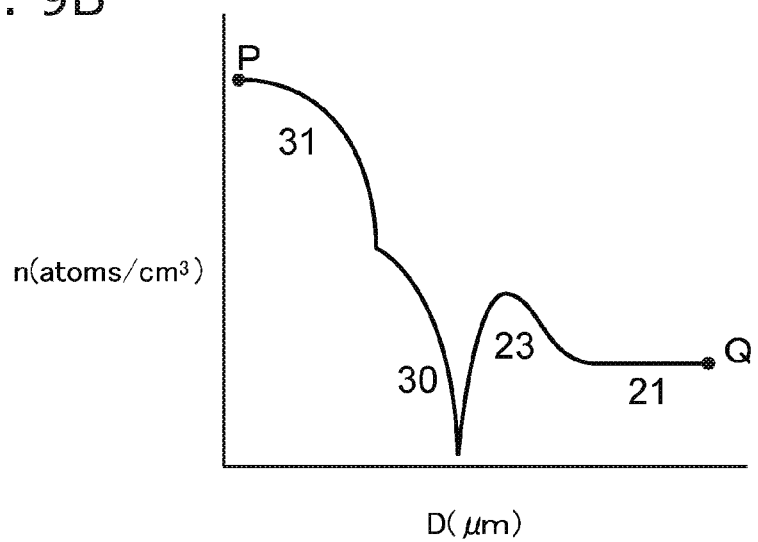
FIG. 9B is a graph showing an impurity concentration profile in a portion of the semiconductor device according to the fifth embodiment.

FIG. 9A is a schematic sectional view showing a semiconductor device according to a fifth embodiment. FIG. 9B is a graph showing an impurity concentration profile in a portion of the semiconductor device according to the fifth embodiment. The horizontal axis of FIG. 9B indicates depth (μm) in the Z-axis direction from a point P of FIG. 9A, and the vertical axis indicates impurity concentration (atoms/cm³).

A semiconductor device 5 shown in FIG. 9A includes an n-type semiconductor region 23 between an n⁻-type semiconductor region 21 and a p-type semiconductor region 30. The maximum value of the impurity concentration of the n-type semiconductor region 23 is, for example, $1 \times 10^{18}$ cm⁻³ or less. When an n-type semiconductor region 20 includes the n-type semiconductor region 23, the impurity concentration of the n-type semiconductor region 20 on a side of a second electrode 11 is higher than the impurity concentration on a side of a first electrode 10 (FIG. 9B). For example, the impurity concentration of the semiconductor region 20 on the side of the second electrode 11 is higher than the impurity concentration on the side of the first electrode 10 between the adjacent connection regions 12 (e.g. connection region 12a or connection region 12a).

The n-type semiconductor region 23 of high concentration is provided between the n⁻-type semiconductor region 21 and the p-type semiconductor region 30. Thus, the impurity concentration of a p⁺-type semiconductor region 31 approaches the impurity concentration of the n-type semiconductor region 23 in the semiconductor device 5. Thereby, the hole injection efficiency from the p⁺-type semiconductor region 3 is reduced in the semiconductor device 5. Thereby, the recovery time is further shortened in the semiconductor device 5.

Sixth Embodiment

Figure 10:
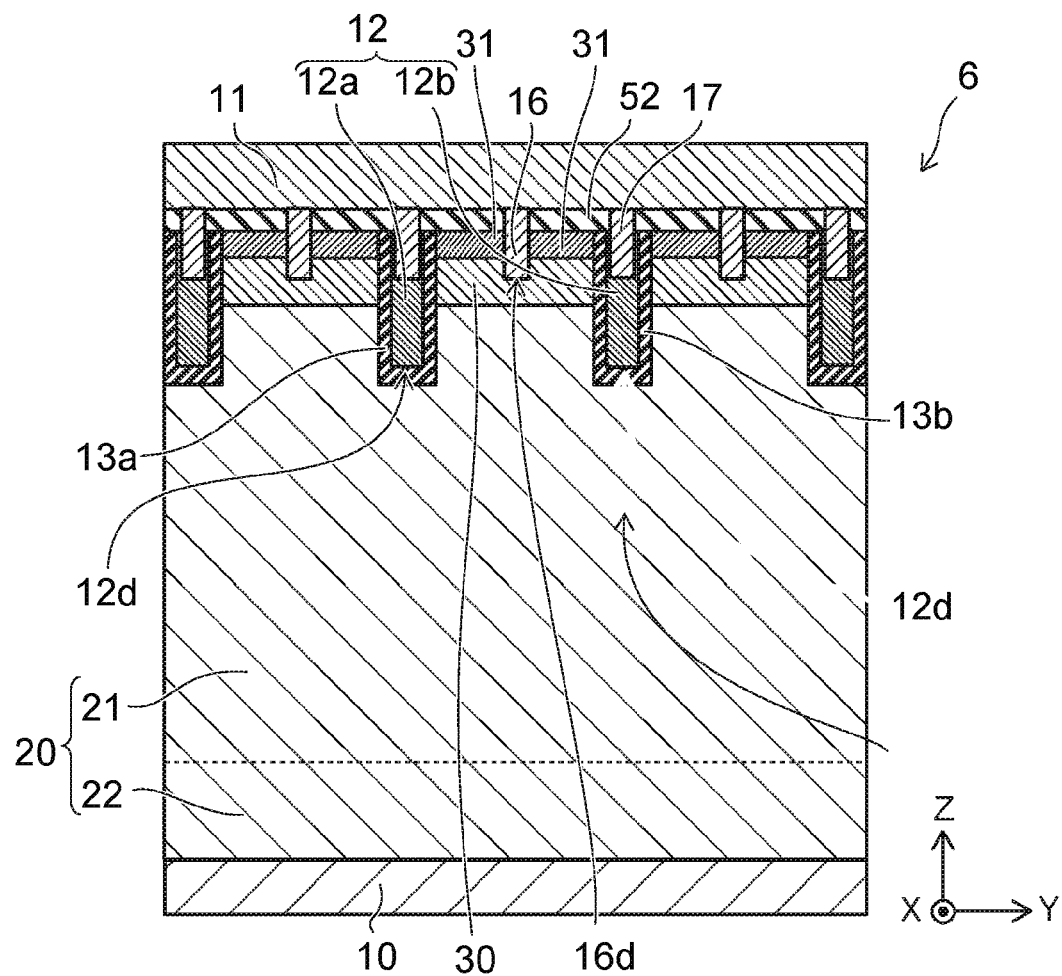
FIG. 10 is a schematic sectional view showing a semiconductor device according to a sixth embodiment.

FIG. 10 is a schematic sectional view showing a semiconductor device according to a sixth embodiment.

A semiconductor device 6 shown in FIG. 10 further includes a third insulating film (hereinafter, for example, an insulating film 52) and a first conductive region (hereinafter, for example, a conductive region 17). The insulating film 52 is provided between a second electrode 11 and a p⁺-type semiconductor region 31. The conductive region 17 electrically connects a connection region 12 (e.g. connection region 12a or connection region 12a) and the second electrode. For example, the length of the conductive region 17 in the Z-axis direction is equal to the length of a connection region 16.

The insulating film 52 and the conductive region 17 as stated above are provided, so that a combined process with another semiconductor device such as an IGBT (Integrated Gate Bipolar Transistor) is simplified. This example will be described in the following embodiment.

Seventh Embodiment

Figure 11:
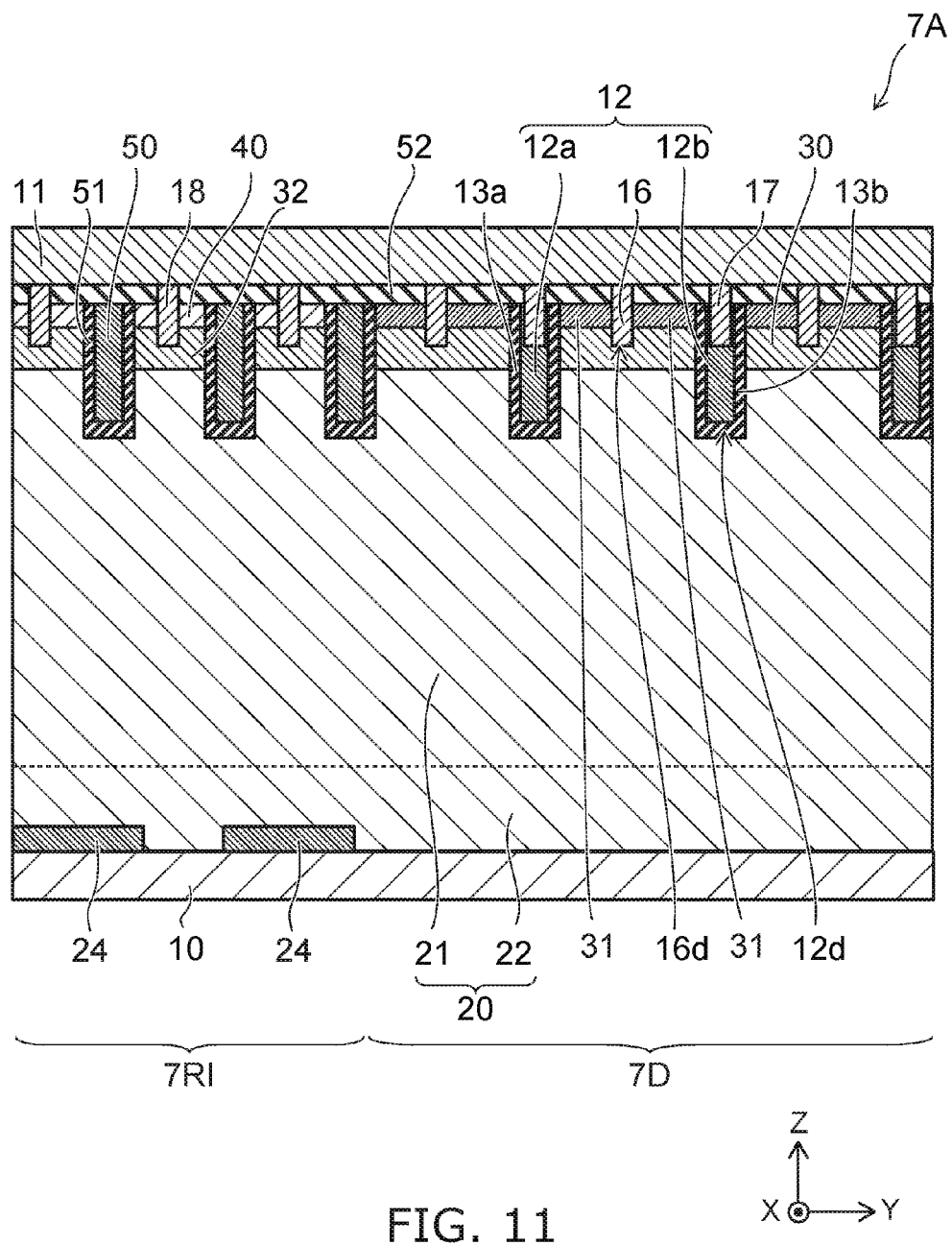
FIG. 11 is a schematic sectional view showing a semiconductor device according to a first example of a seventh embodiment.
Figure 12:
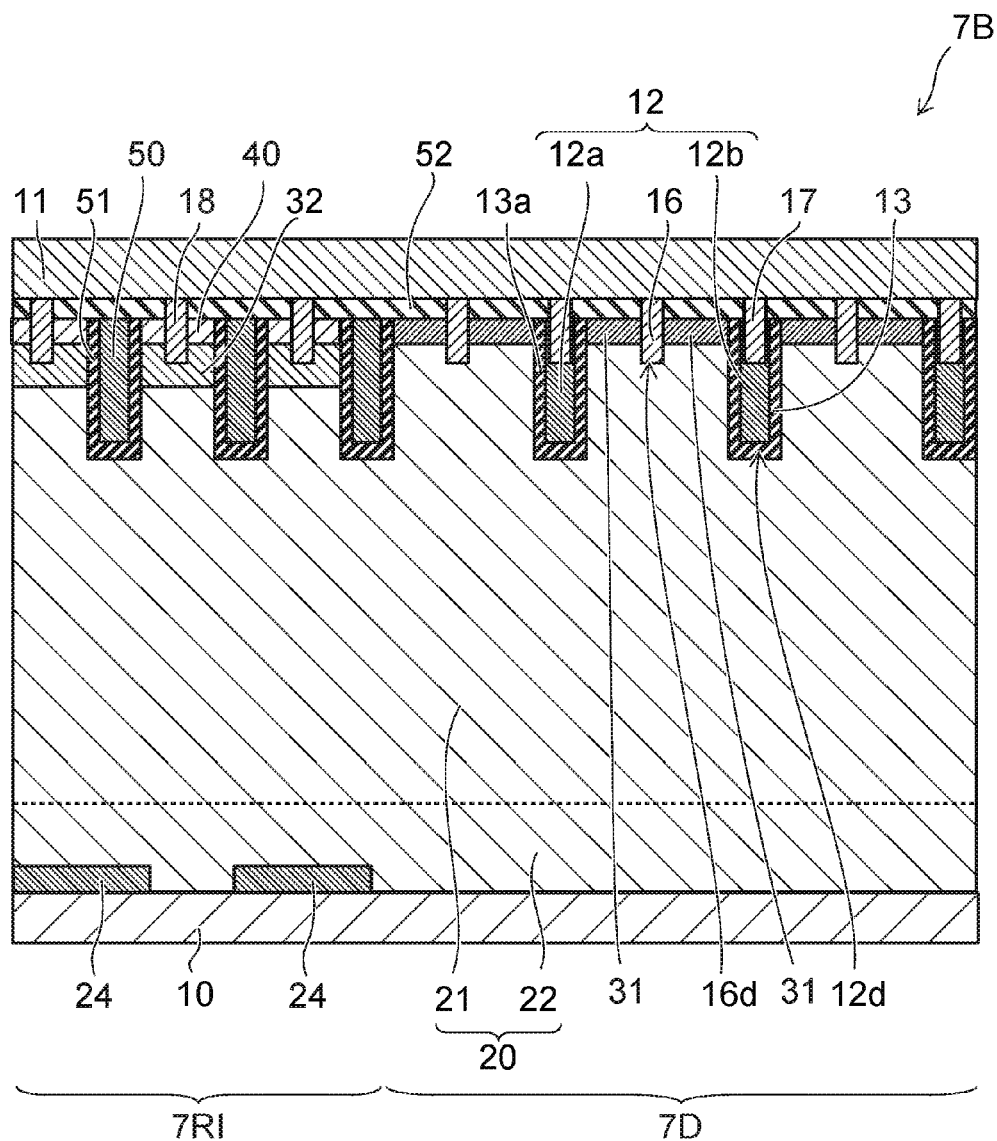
FIG. 12 is a schematic sectional view showing a semiconductor device according to a second example of the seventh embodiment.

FIG. 11 is a schematic sectional view showing a semiconductor device according to a first example of a seventh embodiment. FIG. 12 is a schematic sectional view showing a semiconductor device according to a second example of the seventh embodiment.

A semiconductor device 7A shown in FIG. 11 is a composite semiconductor device (RC-IGBT (Reverse Conducting-IGBT)) of the foregoing semiconductor device 6 and an IGBT (Integrated Gate Bipolar Transistor). The semiconductor device 7A includes a diode region 7D where the semiconductor device 6 is provided and an IGBT region 7RI where the IGBT is provided.

The semiconductor device 7A further includes a third semiconductor region (hereinafter, for example, a p-type base region 32), a fourth semiconductor region (hereinafter, for example, an n⁺-type emitter region 40), plural third electrodes (hereinafter, for example, gate electrodes 50), a fourth insulating film (hereinafter, for example, a gate insulating film 51), a fifth semiconductor region (hereinafter, for example, a p⁺-type collector region 24) and a connection region 18 in addition to the configuration of the semiconductor device 6.

For the IGBT, a first electrode 10 is a collector electrode, and a second electrode 11 is an emitter electrode. The p-type base region 32 is provided between an n-type semiconductor region 20 and the second electrode 11. The n⁺-type emitter region 40 is provided between the p-type base region 32 and the second electrode 11. The n⁺-type emitter region 40 is electrically connected to the second electrode 11. In general, the impurity concentration of the p-type base region 32 is lower than the impurity concentration of the p⁺-type semiconductor region 31 and higher than the impurity concentration of the p-type semiconductor region 30.

Each of the plural gate electrodes 50 reaches the n-type semiconductor region 20 from the n⁺-type emitter region 40 in a direction directed from the second electrode 11 to the first electrode 10. Each of the plural gate electrodes 50 extends in the n⁺-type emitter region 40, in the p-type base region 32 and in the n-type semiconductor region 20 in the direction directed from the second electrode 11 to the first electrode 10. The plural gate electrodes 50 are respectively arranged in the Y-axis direction.

The connection region 18 is provided between the gate electrodes 50 adjacent to each other in the Y-axis direction. The connection region 18 extends in an insulating film 52, the n⁺-type emitter region 40 and the p-type base region 32 in the direction directed from the second electrode 11 to the first electrode 10. The n⁺-type emitter region 40 is electrically connected to the second electrode 11 through the connection region 18.

The gate insulating film 51 is provided between one of the plural gate electrodes 50 and the n⁺-type emitter region 40, between the one of the plural gate electrodes 50 and the p-type base region 32, and between the one of the plural gate electrodes 50 and the n-type semiconductor region 20.

The p+-type collector region 24 is provided between the first electrode 10 and the n-type semiconductor region 20. The p+-type collector region 24 is selectively provided on the first electrode 10. The p+-type collector region 24 may be provided on the entire region of the first electrode 10 of the IGBT region 7RI. The p+-type collector region 24 is positioned between the first electrode 10 and the plural gate electrodes 50. An n+-type semiconductor region 22 contacts the first electrode 10 between the p+-type collector regions 24 arranged in the Y-axis direction.

A diode to be combined with the IGBT is not limited to the semiconductor device 6. For example, in a semiconductor device 7B shown in FIG. 12, the p-type semiconductor region 30 is removed from the semiconductor device 7A. That is, the semiconductor device 7B is a semiconductor device in which the IGBT and a diode having substantially the same configuration as the semiconductor device 1 are combined.

In each of the semiconductor devices 1 to 6, when the insulating film 52 and the conductive region 17 are additionally provided, the IGBT and each of the semiconductor devices 1 to 6 can be manufactured by using the same semiconductor substrate. That is, coordination between the manufacturing process to the IGBT and the manufacturing process of each of the semiconductor devices 1 to 6 becomes excellent.

In the embodiments described above, the term "on" in "a portion A is provided on a portion B" may refer to not only the case where the portion A is provided on the portion B such that the portion A is in contact with the portion B but also the case where the portion A is provided above the portion B such that the portion A is not in contact with the portion B. Furthermore, "a portion A is provided on a portion B" may refer to the case where the portion A and the portion B are inverted and the portion A is located below the portion B and the case where the portion A and the portion B are laterally juxtaposed. This is because, even when the semiconductor device according to the embodiment is rotated, the structure of the semiconductor device is not changed by the rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first electrode;
    a second electrode;
    a first semiconductor region of first conductivity type provided between the first electrode and the second electrode;
    a second semiconductor region of second conductivity type provided between the first semiconductor region and the second electrode, the second semiconductor region being in contact with the first semiconductor region, no first conductive semiconductor region being provided between the second semiconductor region and the second electrode;
    a first connection region directly connected to the second electrode, the first connection region reaching the first semiconductor region from the second electrode;
    a second connection region directly contacting the second electrode, the second connection region reaching the first semiconductor region from the second electrode, and the first connection region and the second connection region being arranged in a second direction crossing a first direction from the second electrode toward the first electrode;
    a first insulating film provided between the first connection region and the second semiconductor region and between the first connection region and the first semiconductor region;
    a second insulating film provided between the second connection region and the second semiconductor region and between the second connection region and the first semiconductor region; and
    a third connection region extending through the second semiconductor region in the first direction and provided between the first connection region and the second connection region in the second direction, the third connection region being electrically connected to the second electrode, and being made of metal, wherein
    a first distance from a bottom surface of the third connection region to a top surface of the first electrode is smaller than a second distance from a bottom surface of the second semiconductor region to the top surface of the first electrode.

2. The device according to claim 1, wherein the first distance is larger than a third distance from a bottom surface of the first connection region or a bottom surface of the second connection region to the top surface of the first electrode.

3. The device according to claim 1, wherein an impurity concentration of the first semiconductor region is $1\times10^{15}$ $cm^{-3}$ or less.

4. The device according to claim 1, wherein the second semiconductor region is divided by the first connection region and the second connection region in the second direction.

5. The device according to claim 4, wherein the second semiconductor region is provided between the first connection region and the second connection region in the second direction and the second semiconductor region is divided by the third connection region.

6. The device according to claim 1, wherein a p-n junction is provided between the first connection region and the third connection region or between the second connection region and the third connection region.

7. A semiconductor device comprising:
a first electrode;
a second electrode;
a first semiconductor region of first conductivity type provided between the first electrode and the second electrode;
a second semiconductor region of second conductivity type provided between the first semiconductor region and the second electrode, the second semiconductor region being in contact with the first semiconductor region, no first conductive semiconductor region being provided between the second semiconductor region and the second electrode;
at least two first connection regions directly contacting the second electrode, and reaching the first semiconductor region from the second electrode;
a second connection region provided between the at least two first connection regions, directly contacting the second electrode, and extending from the second electrode to the first electrode through the second semiconductor region, the second connection region being made of metal, wherein
the at least two first connection regions are provided to be closer to the first electrode than the second connection region.

8. The device according to claim 7, further comprising:
a first insulating layer provided between the first semiconductor region and each of the at least two first connection regions, and between the second semiconductor region and each of the at least two first connection regions.

9. The device according to claim 7, wherein
the second semiconductor region includes a portion provided between each of the at least two first connection regions and the second connection region, and
the second connection region has a first width equal to or larger than a second width of the portion of the second semiconductor region, the first width and the second width being defined in a direction from the second connection region to one of the at least two first connection regions.

10. The device according to claim 7, wherein
the second connection region directly contacts the first semiconductor region.

11. The device according to claim 7, wherein a pn-junction is provided at an interface between the first semiconductor region and the second semiconductor region.

12. The device according to claim 7, wherein
the second connection region are provided to be closer to the first electrode than the second semiconductor region.

13. The device according to claim 7, further comprising:
a third semiconductor region of the second conductivity type provided between the first semiconductor region and the second semiconductor region, an impurity concentration of the second conductivity type of the third semiconductor region being lower than an impurity concentration of the second conductivity type of the second semiconductor region.

14. The device according to claim 13, wherein the third semiconductor region is provided to be closer to the first electrode than the second connection region.

* * * * *